United States Patent
Scott et al.

[19]

[11] Patent Number: 6,094,043

[45] Date of Patent: Jul. 25, 2000

[54] ARC DETECTION SENSOR UTILIZING DISCRETE INDUCTORS

[75] Inventors: Gary W. Scott, Mount Vernon, Iowa; Stanley J. Brooks, Rockvale, Tenn.

[73] Assignee: Square D Company, Palatine, Ill.

[21] Appl. No.: 09/060,594

[22] Filed: Apr. 15, 1998

[51] Int. Cl.$^7$ .................................................. G01R 33/00
[52] U.S. Cl. ................................. 324/117 R; 324/127
[58] Field of Search .............................. 324/117 R, 127, 324/126, 117 H, 522, 76.45; 364/483, 484; 361/42, 49–50, 93, 100–102

[56] References Cited

U.S. PATENT DOCUMENTS

| | | | |
|---|---|---|---|
| 4,233,640 | 11/1980 | Klein et al. ................................. | 361/44 |
| 4,378,525 | 3/1983 | Burdick ................................. | 324/117 R |
| 4,616,200 | 10/1986 | Fixemer et al. ........................... | 335/35 |
| 4,702,002 | 10/1987 | Morris et al. .............................. | 29/837 |
| 4,839,600 | 6/1989 | Kuurstra ................................. | 324/117 R |
| 5,442,280 | 8/1995 | Baudart ................................... | 324/127 |
| 5,617,019 | 4/1997 | Etter ...................................... | 324/117 R |
| 5,805,397 | 9/1998 | MacKenzie ................................ | 361/42 |
| 5,805,398 | 9/1998 | Rae .......................................... | 361/42 |
| 5,815,352 | 9/1998 | Mackenzie ................................ | 361/42 |
| 5,818,237 | 10/1998 | Zuercher et al. ........................ | 324/536 |
| 5,818,671 | 10/1998 | Seymour et al. ......................... | 361/42 |
| 5,835,319 | 11/1998 | Welles, II et al. ......................... | 361/5 |
| 5,835,321 | 11/1998 | Elms et al. ................................ | 361/45 |

FOREIGN PATENT DOCUMENTS

| | | | |
|---|---|---|---|
| 0158365 | 6/1989 | Japan ................................. | 324/117 R |

*Primary Examiner*—Jay Patidar
*Attorney, Agent, or Firm*—Kareem M. Irfan; Larry I. Golden

[57] ABSTRACT

An alternating current sensing apparatus includes at least two coils, each having a plurality of turns of wire around a core which defines a linear axis. The coils are mounted in spaced relation on a support surface so as to define an intermediate space, and the coils are electrically coupled additively in series. The coils produce a detectable signal in response to an alternating electrical current passing through a conductor which extends through the intermediate space.

28 Claims, 3 Drawing Sheets

ARC DETECTION SENSOR UTILIZING DISCRETE INDUCTORS

FIELD OF THE INVENTION

This invention is directed generally to alternating current sensors, and more particularly to an alternating current sensor using discrete inductors or coils which may be used to detect arcing in electrical circuits.

BACKGROUND OF THE INVENTION

Generally speaking, alternating current has been detected by the use of di/dt detector coils in connection with various electrical fault detection systems for use with electrical apparatus, and/or with electrical wiring systems in residential, commercial and industrial applications. In such electrical systems, electrical power is generally routed through protection devices to designated branch circuits supplying one or more loads. Suitable overcurrent and/or arcing fault detector devices may be utilized to provide triggering signals for operating circuit protection devices such as circuit breakers, which are designed to interrupt the electrical current upon the detection of certain predefined fault conditions in the circuit. Similar di/dt sensing and fault detector devices may be used for similar purposes in applications other than electrical systems, for example in individual electrically powered devices, such as industrial machinery, commercial equipment, or residential appliances.

Generally speaking, the di/dt sensors for such applications have consisted of toroidal coils having a central through opening, through which the wire or other conductor to be monitored extends.

The construction and use of such toroidal coils is generally well known. However, the toroidal coil heretofore proposed for such arc detection or other current detection applications can be relatively expensive and difficult to mass produce. Examples of such toroidal coils as shown for example in U.S. Pat. applications Ser. No. 08/403,033 filed Mar. 13, 1995 and entitled "Current Sensing Arcing Fault Detector and Method," now abandoned and Ser. No. 08/403,084, filed Mar. 13, 1995 and entitled "Device and Method for Testing Arcing Fault Detectors," now abandoned.

One other device for measuring an electrical current in a conductor utilizes a so-called Rogowski coil, which is generally a printed circuit plate provided with a circular cutout, with a coil being implemented by metal deposits on each of the two faces of the plate and extending along radii such that geometrical projections thereof pass through the center of the cutout. Electrical connections between the radii on the two faces are implemented by plated through holes that pass through the thickness of the plate. Such a Rogowski coil for measuring an electrical current in a conductor is shown for example in U.S. Pat. No. 5,442,280. However, the Rogowski coil as shown in the above-referenced patent is also relatively complicated, expensive and difficult to produce.

OBJECTS OF THE INVENTION

Accordingly, it is a general object of the invention to provide a novel and improved alternating current detecting device which utilizes relatively simple and inexpensive, or even "off-the-shelf" types of inductor or coil components.

A related object is to provide a low permeability sensor for high frequency arc detection without saturation.

Yet another object is to provide a simple and relatively inexpensive method for sensing an alternating current, utilizing relatively simple and inexpensive inductor or coil components.

SUMMARY OF THE INVENTION

Briefly, and in accordance with the foregoing objects, an alternating current sensing apparatus comprises a circuit board defining a support surface, at least two coils, each of said coils comprising a plurality of turns of wire around a core which defines a linear axis, said coils being mounted in spaced relation on said support surface so as to define an intermediate space, and said coils being electrically coupled additively in series, whereby said coils produce a detectable signal in response to an alternating electrical current passing through a conductor which extends through said intermediate space.

In accordance with another aspect of the invention, a low permeability sensor for high frequency arc detection without saturation, comprises a support member defining a support surface, at least two coils, each of said coils comprising a plurality of turns of wire around a core which defines a linear axis, said coils being mounted in spaced relation on said support surface so as to define an intermediate space, and said coils being electrically coupled additively in series, whereby said coils produce a detectable signal in response to an alternating electrical current passing through a conductor which extends through said intermediate space.

In accordance with another aspect of the invention a method for detecting alternating current comprises aligning a plurality of elongated axially wound inductor end-to-end on a support surface so as to define a closed polygon, providing a through opening in said circuit board in the polygon defined by said inductors, and passing a conductor through said opening.

DESCRIPTION OF ILLUSTRATIVE EMBODIMENTS

Figure 1:
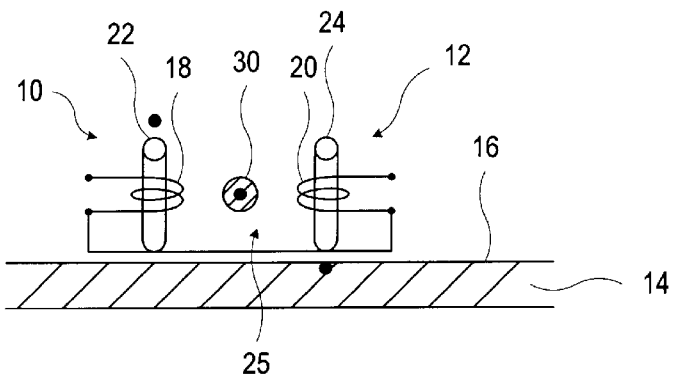
FIG. 1 is a side elevation, partially in section, showing an alternating current sensor in accordance with one embodiment of the invention.

While the invention is susceptible to various modifications and alternative forms, specific embodiments have been shown by way of example in the drawings and will be described in detail herein. However, it should be understood that the invention is not intended to be limited to the particular details disclosed. Rather, the invention is to cover all modifications, equivalents and alternatives falling within the spirit and scope of the invention as defined by the appended claims.

The present invention provides an alternating current sensing device or apparatus, which may be a low permeability sensor for high frequency arc detection without saturation. This sensing apparatus or sensor is preferably configurative of relatively few and simple "off-the-shelf" type components. Preferably, relatively simple coils or inductors are utilized and are placed in a given orientation on a relatively flat surface such as a circuit board, such that the coils will produce a detectable current output in response to an alternating current passing through a wire or conductor which passes between the respective coils. Preferably, the two or more coils are physically arranged such that the magnetic fields induced by the current are additive. Moreover, in the embodiments shown, the coils are electrically interconnected additively in series, such that the currents induced therein are added, in order to produce a more easily detectable signal above the ambient noise level. That is, the respective inductors are preferably arranged such that their magnetic fields add rather than cancel each other and such that the electrical currents which they produce add in series.

While the foregoing may be accomplished in a number of ways, the various figures of drawings illustrate a number of embodiments of an apparatus for detecting alternating current in accordance with the principals of the invention.

Figure 2:
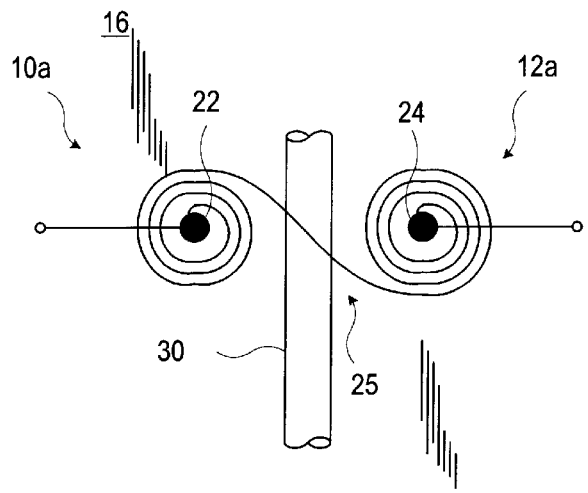
FIG. 2 is a top plan view of an alternating current sensor in accordance with another embodiment of the invention.

Referring first to FIG. 1, a pair of coils 10, 12 which may be substantially identical coils or inductors, are arranged or mounted to a circuit board or other support member or body 14 which has a substantially flat or planar support surface 16. In FIG. 1, the coils 10, 12 generally comprise a plurality of turns of wire 18, 20 around respective cores 22, 24. The cores each define a linear axis with the coils being mounted in a spaced apart relation on the support surface 16 such that these linear axes are parallel with each other and perpendicular with the surface 16. In the embodiment of FIG. 1, the coils are mounted in opposite polarity, as indicated by the respective polarity dots, one above coil 10 and the other below coil 12. The respective wires 18 and 20 from the coils 10 and 12 are electrically coupled additively in series, such that the coils will produce a detectable signal in response to an alternating electrical current passing through a conductor 30 which extends through a space 25 which is defined intermediate or between the two coils 10 and 12. A similar arrangement of coils 10a and 12a is shown in FIG. 2, with the coils 10a and 12a being generally spiral wound, whereas the coils in FIG. 1 are more conventionally helically wound.

Figure 3:
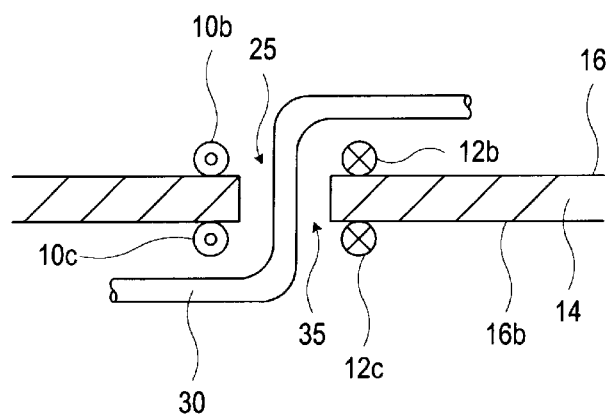
FIG. 3 is a side elevation, partially in section, showing an alternating current sensor in accordance with yet another embodiment of the invention.

Referring to FIG. 3, similar coils 10b and 12b are mounted on the surface 16 with their axes generally parallel to the surface 16 of the circuit board or other support member 14. The coils 10b and 12b are otherwise substantially the same as the coils 10 and 12 of FIG. 1. It will be noted that the polarity orientations of coils 10b and 12b are shown as opposite with the dot and X indicating polarity in FIG. 3. FIG. 3 additionally illustrates alternative features, including a through opening 35 in the circuit board or body 14 between the coils 10b and 12b through which the conductor 30 is directed. Thus, in the embodiment of FIG. 3, at least the portion of the wire or conductor 30 running through the opening 35 is generally perpendicular to the surface 16 and to the axes of the respective coils 10b and 12b.

Also, in the embodiment of FIG. 3, two additional coils 10c and 12c which are substantially similar to coils 10b and 12b are mounted on an opposite planar support surface 16b of the support member or circuit board 14. These additional coils 10c and 12c have their polarities as indicated, namely, such that the polarity of coil 10c is identical with that of 10b and the coil 12c is identical with that of 12b. The coils 10c and 12c are similarly surface mounted such that their axes are parallel to the flat or planar surface 16 and such that the respective pairs of coils 10b, 10c and 12b, 10c to either side of the opening 35 are substantially symmetrically aligned with respect to each other and with respect to the opening 35. As mentioned above, the through opening 35 is located in the space 25 intermediate or between the respective coils 10b, 10c on one side and 12b, 12c on the other side.

Figure 4:
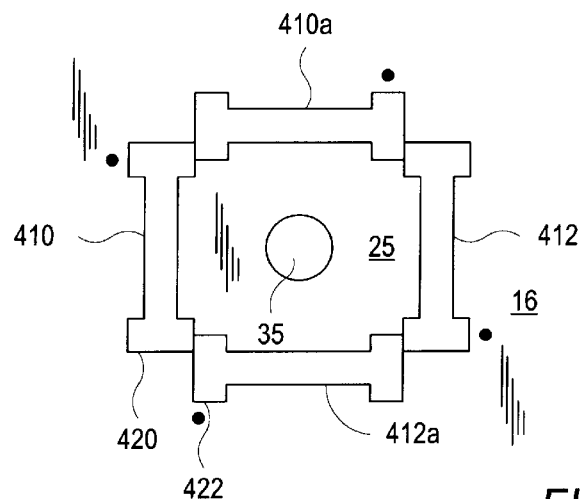
FIG. 4 is a top plan view showing an alternating current sensor in accordance with another embodiment of the invention.
Figure 5:
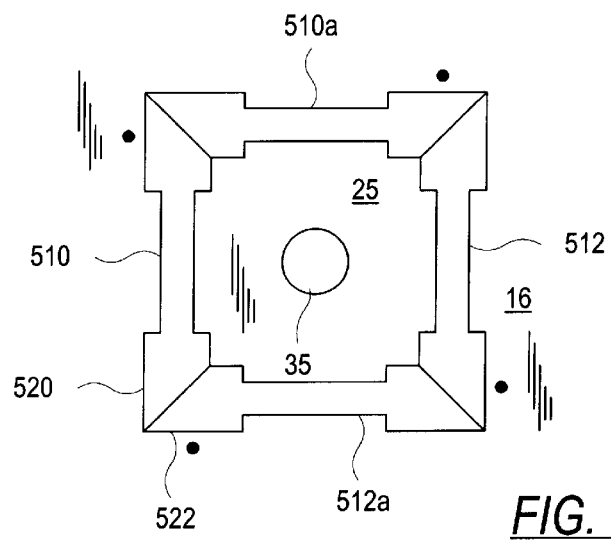
FIG. 5 is a top plan view similar to FIG. 4 showing yet another embodiment of the invention.
Figure 6:
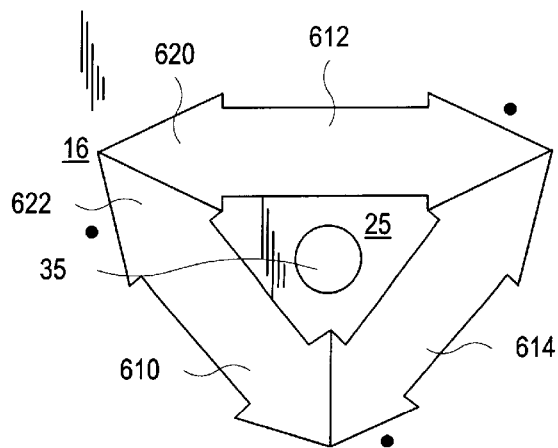
FIG. 6 is a top plan view similar to FIGS. 4 and 5 showing yet another embodiment of the invention.

Referring next to FIGS. 4 through 6, further similar embodiments of sensor arrangements in accordance with the invention are illustrated. In each of FIGS. 4 through 6, three or more coils are arranged end-to-end on the support surface 16 so as to define a polygonal shape of the intermediate space 25. In FIGS. 4 and 5 four such coils are illustrated, while FIG. 6 illustrates three such coils. The coils of FIG. 4 are designated 410, 412, 410a and 412a, while the coils of FIG. 5 are designated 510, 512, 510a and 512a. The coils of FIG. 6 are designated by reference numerals 610, 612 and 614. All of the coils in FIGS. 4, 5 and 6 are surface mounted on their respective associated support surfaces 16 such that longitudinal axis of each of the coils is parallel to the associated surface 16. The respective polarities of the coils are also indicated by polarity dots in FIGS. 4, 5 and 6, respectively.

Moreover, in each of FIGS. 4, 5 and 6, each of the coils has respective soft magnetic cores, which are respectively arranged in abutting relation to form the closed polygons as illustrated in FIGS. 4 through 6. Two such abutting ends are indicated respectively by reference numerals 420, 422 in FIG. 4, and by reference numerals 520, 522 in FIG. 5, and by reference numerals 620 and 622 in FIG. 6, it being understood that the other respective abutting ends or end caps are substantially similar in each of these embodiments. In the embodiments of FIGS. 5 and 6, the ends or end caps are further beveled or angled at an angle of 180° divided by the number of coils, such that adjacent ends have faces engaged along complementary surfaces. Thus, 45° end faces are provided in FIG. 5 and 60° end faces are provided in FIG. 6.

Figure 7:
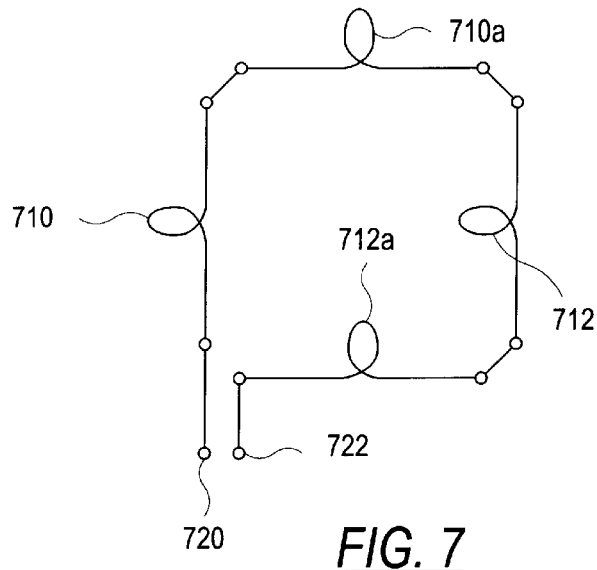
FIG. 7 is a schematic circuit diagram illustrating the circuit connections of the embodiments of FIGS. 4 and 5.

Referring briefly to FIG. 7, an example of the additive series connections of the four coils in either of FIGS. 4 or 5 is illustrated, such that a signal can be detected across output terminals 720, 722. For convenience, the coils of FIG. 7 have been separately designated by reference numerals 710, 712 and 710a, 712a.

Figure 8:
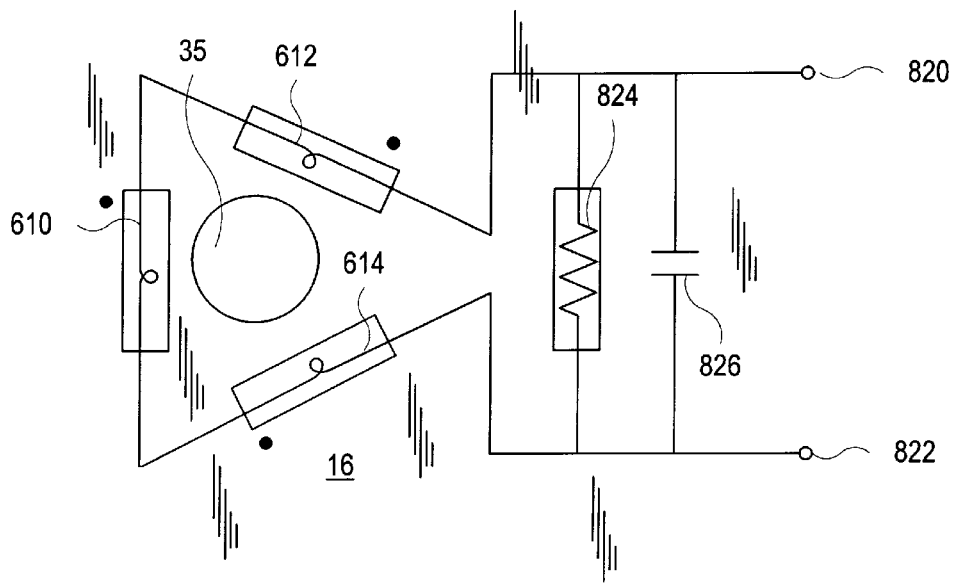
FIG. 8 is a schematic circuit diagram of a circuit for use in connection with the embodiment of FIG. 6.

FIG. 8 illustrates a similar circuit configuration for the coils of FIG. 6, where the coils are additively coupled in series so as to provide an output signal across output terminals 820 and 822. FIG. 8 also illustrates a bandpass filter, for example in the form of a resistor 824 and a capacitor 826 which are coupled in series across the output terminals 820, 822. These filter components may be of selected value to isolate frequencies of interest for a given application. Moreover, the capacitance of capacitor 826 is preferably much greater than the stray winding capacitances of the respective inductors or coils 610, 612 and 614 such that the stray capacitances become essentially insignificant. In one specific example, in the circuit of FIG. 8, each of the inductors 610, 612 and 614 was selected as a one thousand microhenry (1000 mh) inductor having a DC resistance of substantially 60 ohms, such as J.W. Miller Part No. 78F102J. The resistor 24 was selected as 10k ohms and the capacitor 826 as 470 pF. Other values of these components might be selected for specific applications without departing from the invention.

While a number of orientation of the coils and the conductor whose current is to be sensed thereby have been illustrated and described herein, other orientations may be used without departing from the invention as defined by the claims which follow.

Regarding the inductors, various inductors other than those identified above might be utilized without departing from the invention, depending upon the application. For example, the inductor shown and described above with reference to FIGS. 1 and 3 and FIGS. 4 through 6 may be of the type sometimes referred to as linear unshielded or axially wound solenoids. The number of windings and material selected for the core (either air core or ferrite or other materials) may be selected consistent with the desired application, it being generally known that ferrite coils will give a relatively stronger signal output. The signal output strength is also generally proportional to the inductance of the coil for a coil of a given size. However, inductance is also generally proportional to the cross-sectional area of the coils and to the number of turns of wire.

Thus, the selection of the core type, and inductance value will depend upon a number of factors including whether the output is to form an input to a high impedance or a low impedance device, or any requirements affecting the size or cost of the individual inductors. In addition, with a ferrite coil, saturation will occur at a relatively lower level, such that a ferrite coil may be suitable for sensing low currents in the conductor 35, whereas an air core might be used in the presence of relatively higher currents. Similarly, when selecting more turns on the inductor, higher voltage output but lower current output will generally result. The selection of output characteristics will usually be dependent upon the input characteristics of the device into which the output is feeding for a given application.

Regarding selection of the number of turns on each coil, the winding capacitance will go up with the number of turns, which in turn reduces the usefull frequency range of the coil. Thus, the number of turns may be selected consistent with the desired frequency range of operation for a given application. For example in the case of AC current monitoring, the frequency response requirement of the coils is limited. On the other hand, for detecting arcing currents, which typically include relatively high frequency components, a relatively higher useful frequency range may be desirable.

What has been illustrated and described herein is a method and apparatus for sensing alternating current and/or for high frequency arc detection. The various embodiments described herein may find utility in a wide range of applications.

What is claimed is:

1. An alternating current sensing apparatus comprising:
   a support member defining a support surface;
   at least two coils, each of said coils comprising a plurality of turns of wire around a core which defines a linear axis, said coils being mounted in spaced relation on said support surface so as to define an intermediate space; and
   said coils being electrically coupled additively in series, whereby said coils produce a detectable signal in response to an alternating electrical current passing through a conductor which extends through said intermediate space.

2. The apparatus of claim 1 wherein said at least two coils are substantially identical.

3. The apparatus of claim 1 wherein said support surface comprises a planar surface, and said coils are mounted to said planar surface such that the axes of the cores of said coils are substantially perpendicular to said planar surface.

4. The apparatus of claim 3 wherein said coils are helically wound.

5. The apparatus of claim 3 wherein coils are spiral wound.

6. The apparatus of claim 1 wherein said support surface comprises a planar surface, and said coils are mounted to said planar surface such that the axes of the cores of said coils are substantially parallel to said planar surface.

7. The apparatus of claim 1 wherein said support surface defines a planar surface having a through opening located in said intermediate space for receiving said conductor therethrough, such that an alternating current in said conductor runs generally perpendicular to said planar surface at said through opening.

8. The apparatus of claim 7 wherein said support surface comprises a planar surface, and said coils are four in number, wherein said support member has a second planar surface opposite and parallel to the first planar surface, wherein two of said coils are mounted to either side of said opening on each planar surface, the axes of all of said coils being parallel with said planar surfaces, and with each other, and the respective pairs of coils to either side of said planar surface being substantially symmetrically aligned with respect to said through opening.

9. The apparatus of claim 1 wherein said coils are more than two in number and are arranged end-to-end on said support surface so as to define a polygonal intermediate space.

10. The apparatus of claim 9 wherein said support surface defines a through opening in said polygonal space for receiving said conductor therethrough.

11. The apparatus of claim 9 wherein said coils are elongated, helically wound coils.

12. The apparatus of claim 9 wherein said coils have non-conductive end parts and wherein the end parts of adjacent ones of said coils are touching.

13. The apparatus of claim 12 wherein the end parts of said coils are beveled at an angle of 180° divided by the number of said coils, such that adjacent end parts are engaged along complementary surfaces.

14. The apparatus of claim 9 wherein said support surface comprises a planar surface, and said coils are mounted to said planar surface such that the axes of the cores of said coils are substantially parallel to said planar surface.

15. The apparatus of claim 9 and further including a bandpass filter electrically coupled to said coils.

16. The apparatus of claim 1 wherein said coils are oriented such that any magnetic fields induced therein are additive.

17. A low permeability sensor for high frequency arc detection without saturation, comprising:
   a support member defining a support surface;
   at least two coils, each of said coils comprising a plurality of turns of wire around a core which defines a linear axis, said coils being mounted in spaced relation on said support surface so as to define an intermediate space; and
   said coils being electrically coupled additively in series, whereby said coils produce a detectable signal in response to an alternating electrical current passing through a conductor which extends through said intermediate space.

18. The apparatus of claim 17 wherein said coils are elongated, helically wound coils.

19. The apparatus of claim 17 wherein said coils are more than two in number and are arranged end-to-end on said support surface so as to define a polygonal shape of said intermediate space.

20. The apparatus of claim 19 wherein said support member defines a through opening substantially centrally located in said intermediate space for receiving said conductor therethrough.

21. The apparatus of claim 19 wherein said coils have non-conductive end parts and wherein the end parts of adjacent ones of said coils are touching.

22. The apparatus of claim 21 wherein the end parts of said coils are beveled at an angle of 180° divided by the number of said coils, such that adjacent end parts are engaged along complementary surfaces.

23. The apparatus of claim 19 wherein said support surface comprises a planar surface, and said coils are mounted to said planar surface such that the axes of the cores of said coils are substantially parallel to said planar surface.

24. The apparatus of claim 19 and further including a bandpass filter electrically coupled to said coils.

25. The apparatus of claim 17 wherein said coils are oriented such that any magnetic fields induced therein are additive.

26. A method for detecting alternating current comprising:

aligning a plurality of elongated inductors end-to-end on a support surface so as to define a polygon;

providing a through opening in said support surface in the polygon defined by said inductors; and passing a conductor through said opening.

27. The method of claim 26 and further including the step of electrically connecting said inductors additively in series.

28. The method of claim 26 and further including the step of orienting said coils such that any magnetic fields induced therein are additive.

* * * * *